United States Patent
Yamaguchi

(10) Patent No.: US 8,716,918 B2
(45) Date of Patent: May 6, 2014

(54) DRIVE CIRCUIT AND PHYSICAL QUANTITY MEASURING DEVICE

(71) Applicant: Seiko Epson Corporation, Tokyo (JP)

(72) Inventor: Masayuki Yamaguchi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/911,199

(22) Filed: Jun. 6, 2013

(65) Prior Publication Data

US 2013/0271044 A1    Oct. 17, 2013

Related U.S. Application Data

(63) Continuation of application No. 13/222,700, filed on Aug. 31, 2011, now Pat. No. 8,487,509.

(30) Foreign Application Priority Data

Sep. 2, 2010    (JP) ................................. 2010-196933

(51) Int. Cl.
*H01L 41/08*    (2006.01)

(52) U.S. Cl.
USPC .................................................. 310/316.01

(58) Field of Classification Search
USPC .................................... 310/316.01, 317, 319
See application file for complete search history.

(56) References Cited

U.S. PATENT DOCUMENTS

| | | |
|---|---|---|
| 5,895,998 A | 4/1999 | Saylor |
| 6,566,821 B2 | 5/2003 | Nakatsuka et al. |
| 6,583,534 B1 | 6/2003 | Nakatsuka et al. |
| 6,737,816 B2 | 5/2004 | Nakatsuka et al. |
| 6,794,796 B2 | 9/2004 | Nakatsuka et al. |
| 7,119,475 B2 | 10/2006 | Matsuzaki et al. |
| 8,487,509 B2 * | 7/2013 | Yamaguchi .............. 310/316.01 |

FOREIGN PATENT DOCUMENTS

JP    A-2008-261844    10/2008

OTHER PUBLICATIONS

Mar. 6, 2013 Notice of Allowance issued in U.S. Appl. No. 13/222,700.

* cited by examiner

*Primary Examiner* — J. San Martin
(74) *Attorney, Agent, or Firm* — Oliff PLC

(57) ABSTRACT

In order for keeping the amplitude of the excitation current of a vibrator constant irrespective not only of the temperature variation but also of the manufacturing variation and the variation in frequency, a comparison control circuit for controlling the amplitude of the drive signal for exciting the vibrator includes a comparative voltage supply circuit for supplying the comparative voltage, and the comparative voltage supply circuit generates the comparative voltage with a constant current source and a second resistor made of a material the same as a material of a first resistor included in a current-voltage conversion circuit.

10 Claims, 7 Drawing Sheets

| CONDITION NAME | VARIATION IN RESISTANCE VALUE (TEMPERATURE VARIATION) | VARIATION IN CAPACITANCE (MANUFACTURING VARIATION) | OPERATING FREQUENCY ($f0<f1<f2$) |
|---|---|---|---|
| CONDITION 1 | CONSIDERED | NOT-CONSIDERED | f0 |
| CONDITION 2 | CONSIDERED | CONSIDERED | f0 |
| CONDITION 3 | CONSIDERED | CONSIDERED | f1 |
| CONDITION 4 | CONSIDERED | CONSIDERED | f2 |
FIG. 3A
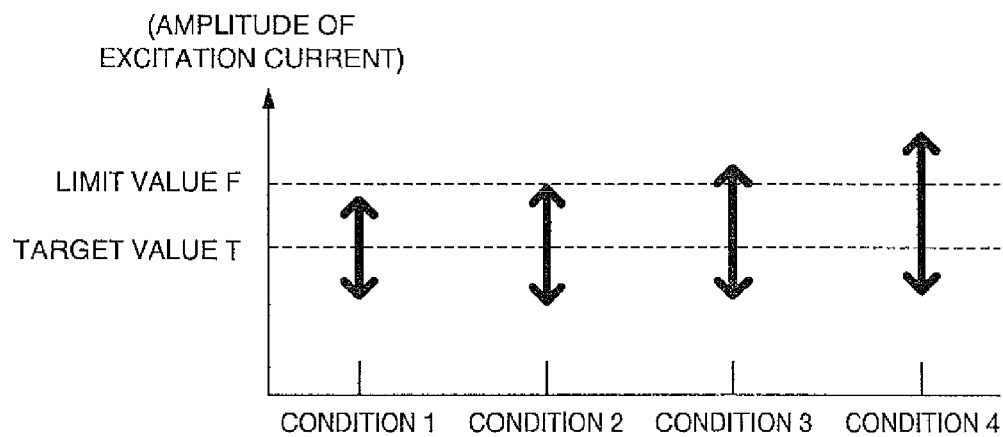
FIG. 3B
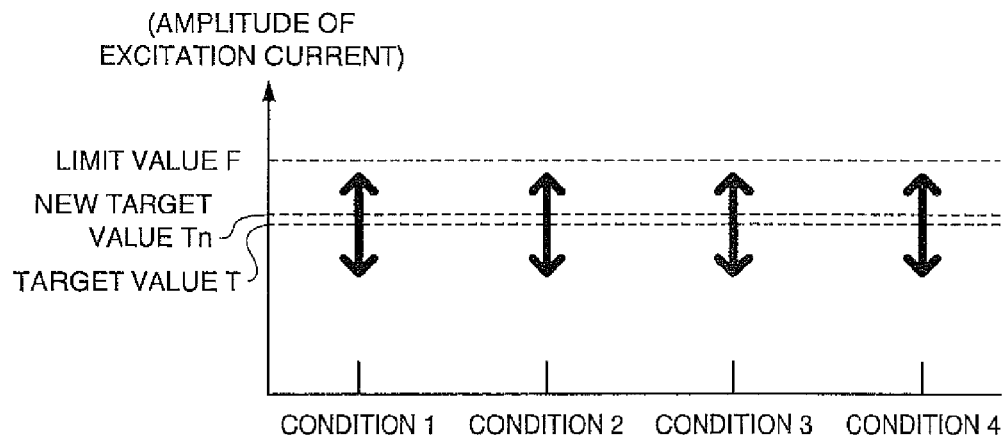
FIG. 3C

DRIVE CIRCUIT AND PHYSICAL QUANTITY MEASURING DEVICE

This is a Division of application Ser. No. 13/222,700 filed Aug. 31, 2011, which claims priority to Japanese Patent Application No. 2010-196933 filed Sep. 2, 2010, the disclosure of which is incorporated herein by reference in its entirety.

BACKGROUND

1. Technical Field

The present invention relates to a drive circuit, a physical quantity measuring device, and so on.

2. Related Art

In general, a physical quantity measuring device using a vibrator outputs a measurement signal proportional to the excitation current of the vibrator. In order for stable measurement, there is required a drive circuit or the like for keeping the amplitude of the excitation current constant irrespective of the temperature variation in the measurement environment. In JP-A-2008-261844 (Document 1) there is disclosed an invention of using an element identical to the resistor element of the detection circuit in the drive circuit to thereby cancel out the temperature variation between the excitation current and the detection current, thus stabilizing the output of the measurement signal.

However, as described in paragraphs 0060 through 0066 of Document 1, if the vibrational frequency of the quartz crystal vibrator is varied, the application thereof becomes difficult. According to Document 1, the problem can be solved by making the resistance value also identical. However, since the circuit design constraints are severe, it is not realistic. Further, the invention of Document 1 fails to go so far as considering the variation during the manufacturing process (hereinafter referred to as a manufacturing variation). For example, the capacitance of a capacitor, which is stable in the case of considering only the temperature characteristics, can naturally include the manufacturing variation. Therefore, in order for accurately detecting the minute variation in the measurement signal, it is required to design the drive circuit of the vibrator taking not only the temperature characteristics but also the manufacturing variation and the variation in frequency into consideration.

SUMMARY

According to some of the aspects of the invention, it is possible to provide a drive circuit or the like for keeping the amplitude of an excitation current of a vibrator constant irrespective not only of the temperature variation but also of the manufacturing variation and the variation in frequency.

(1) According to an aspect of the invention, there is provided a drive circuit adapted to output a drive signal for exciting a vibrator including a current-voltage conversion circuit adapted to convert an excitation current input into a voltage, a full-wave rectifying circuit adapted to perform full-wave rectification on an output voltage from the current-voltage conversion circuit, a drive signal generation circuit adapted to generate the drive signal based on the output voltage from the current-voltage conversion circuit, and a comparison control circuit adapted to compare an output voltage from the full-wave rectification circuit with a comparative voltage to thereby control an amplitude of the drive signal, wherein the comparison control circuit includes a comparative voltage supply circuit adapted to supply the comparative voltage, and the comparative voltage supply circuit generates the comparative voltage with a constant current source and a second resistor made of a material the same as a material of a first resistor included in the current-voltage conversion circuit.

According to this aspect of the invention, by controlling the amplitude of the drive signal based on the comparative voltage, it is possible to keep the amplitude of the excitation current of the vibrator constant. Firstly, since the first resistor included in the current-voltage conversion circuit and the second resistor included in the comparative voltage supply circuit for supplying the comparative voltage are made of the same material, the rate of the variation in the resistance value due to the temperature is the same. Therefore, the variation in the excitation current in accordance with the temperature variation can be prevented.

Here, "the same material" denotes the material with which the characteristics such as the temperature characteristics or the manufacturing variation become the same between the first resistor and the second resistor thus manufactured with the material. If, for example, the temperature characteristics, the manufacturing variation, and so on become the same in the case in which the type (poly-silicon resistor, diffused resistor, well resistor, and so on) of the resistor is the same, the fact that the resistors are the same type can mean that the resistors are made of the same material. Further, it is also possible to determine whether or not the resistors are made of the same material taking not only the type of the resistor but also the local variation into consideration.

Further, the drive circuit of the comparative example described later has the resistor corresponding to the second resistor as, for example, a low-pass filter of the compensation circuit. However, the drive circuit of the aspect of the invention does not require such a compensation circuit, and therefore the design can be simplified, and the circuit scale is also reduced. Further, the capacitance of the capacitor of the low-pass filter provided to the drive circuit of the comparative example has the variation due to the manufacturing variation although the temperature variation is small. As a result, the variation in the capacitance of the capacitor affects the excitation current, and therefore, the difference in the excitation current occurs between the products including the drive circuit even if the temperature condition is the same. The drive circuit according to the aspect of the invention can keep the amplitude of the excitation current of the vibrator constant without causing such a problem.

Further, the gain of the drive circuit of the comparative example has a frequency dependency, and the excitation current tends to increase if, for example, the vibrational frequency is raised. However, in the drive circuit according to the aspect of the invention, the gain does not have the frequency dependency, and the amplitude of the excitation current of the vibrator can be kept constant.

According to the aspect of the invention, it is possible to provide a drive circuit for keeping the amplitude of the excitation current of the vibrator constant irrespective not only of the temperature variation but also of the manufacturing variation and the variation in frequency. It should be noted that the term "constant" here does not mean that the amplitude is exactly equal to the amplitude of the excitation current as the design target, but means that the amplitude is fit into the variation range allowed under the use environment conditions defined by the specification. The "variation range allowed" denotes the range, for example, including the design target and smaller than the limit value. Further, the "limit value" denotes the amplitude of the excitation current with which the breakage current of breaking, for example, the vibrator flows.

(2) In the drive circuit of the aspect of the invention, it is possible that the first resistor and the second resistor are disposed in the same resistor area in an array fashion. According to this configuration, by disposing the first resistor and the second resistor in the same resistor area in the layout, it is possible to eliminate the local resistance variation to thereby keep the amplitude of the excitation current constant eventually. On this occasion, since the first resistor and the second resistor are disposed in an array fashion, the way of arrangement is the same, which makes it difficult to cause the variation in the resistance value due to the shape. Therefore, it is possible to align the temperature characteristics between the first resistor and the second resistor.

(3) In the drive circuit of the aspect of the invention, it is possible that the first resistor and the second resistor are each composed of one of a resistor cell and a combination of a plurality of resistor cells, the resistor cells each having the same resistance value.

According to this configuration, since the first resistor and the second resistor are each composed of a combination of the resistor cells (resistor elements) in the layout, the variation in the resistance value hardly occurs. Therefore, it is possible to align the temperature characteristics between the first resistor and the second resistor.

(4) In the drive circuit of the aspect of the invention, it is possible that the resistance value of the first resistor and the resistance value of the second resistor are determined based on a result of calculation of comparing an amplitude of the excitation current and a limit value with which a breakage current causing breakage of the vibrator flows.

According to this configuration, since the amplitude of the excitation current as the design target can be approximated to the limit value as much as possible, it becomes possible to achieve improvement of the S/N ratio with the physical quantity measuring device using the drive circuit, for example.

(5) In the drive circuit of the aspect of the invention, it is possible that the current-voltage conversion circuit and the comparison control circuit are connected to a common ground potential.

According to this configuration, the current-voltage conversion circuit including the first resistor and the comparison control circuit including the second resistor are connected to the common ground potential to thereby prevent the difference in the temperature characteristics between the both resistors from occurring, and thus, the amplitude of the excitation current can be kept constant. For example, the resistance values of the first resistor and the second resistor are optimized under a certain condition (e.g., a "TYP" condition (typical condition)) in the design process. On this occasion, by connecting them to the common ground potential, it is possible to reduce the variation in the amplitude of the excitation current due to, for example, the temperature variation as much as possible to thereby prevent the amplitude from reaching the limit value.

(6) According to another aspect of the invention, there is provided a physical quantity measuring device including any of the drive circuits according to the aspect of the invention described above.

According to the aspect of the invention, it is possible to provide a physical quantity measuring device capable of performing stable measurement by including the drive circuit for keeping the amplitude of the excitation current of the vibrator constant irrespective not only of the temperature variation but also of the manufacturing variation and the variation in frequency.

BRIEF DESCRIPTION OF THE DRAWINGS

The invention will be described with reference to the accompanying drawings, wherein like numbers reference like elements.

FIG. 3A is a table showing conditions of a simulation. FIG. 3B is a diagram showing a variation in an excitation current in a drive circuit of a comparative example. FIG. 3C is a diagram showing a variation in an excitation current in the drive circuit according to the first embodiment.

DESCRIPTION OF EXEMPLARY EMBODIMENTS

Some embodiments of the invention will hereinafter be explained with reference to the accompanying drawings.

1. First Embodiment

Figure 6:
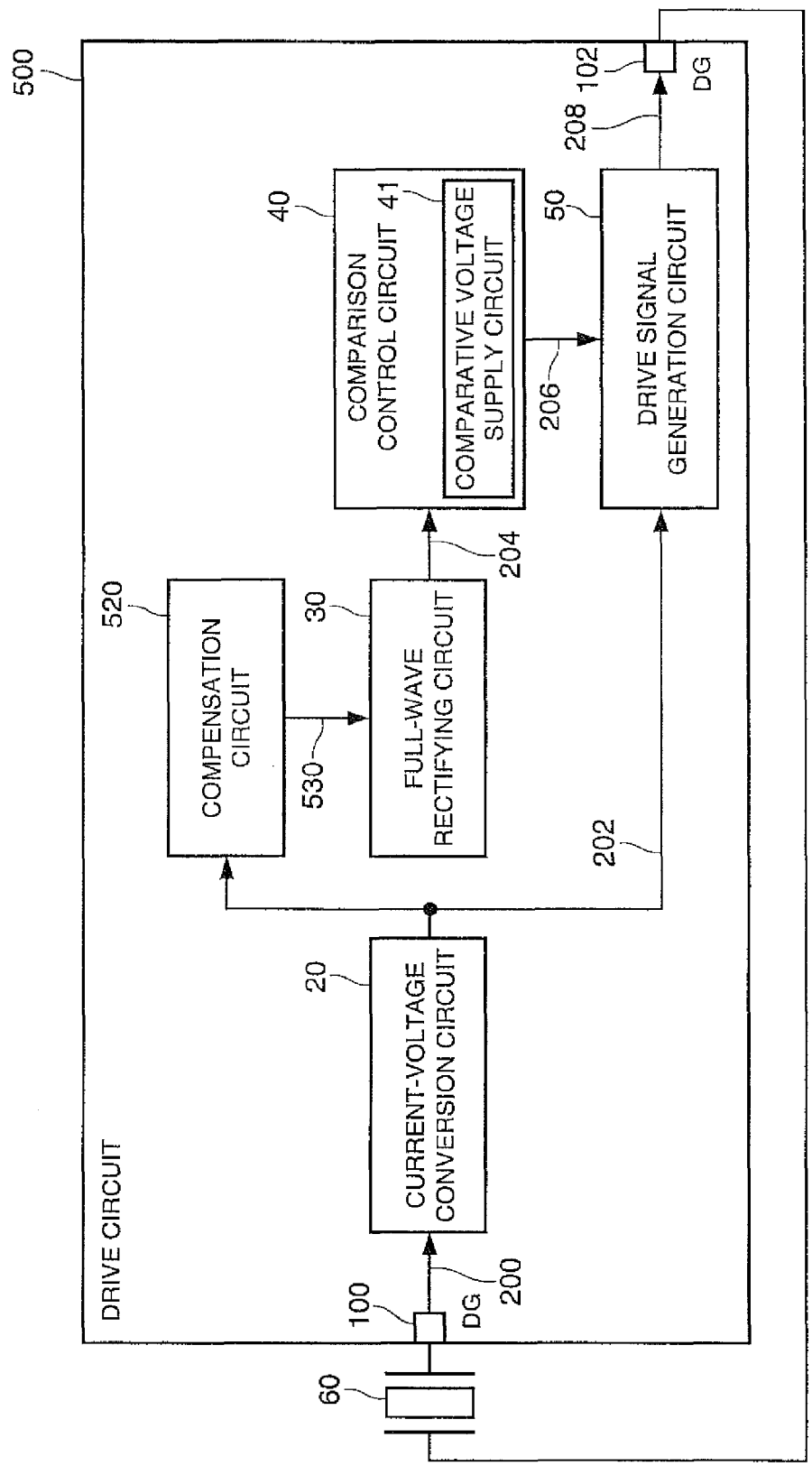
FIG. 6 is a block diagram of a drive circuit of a comparative example.
Figure 7:
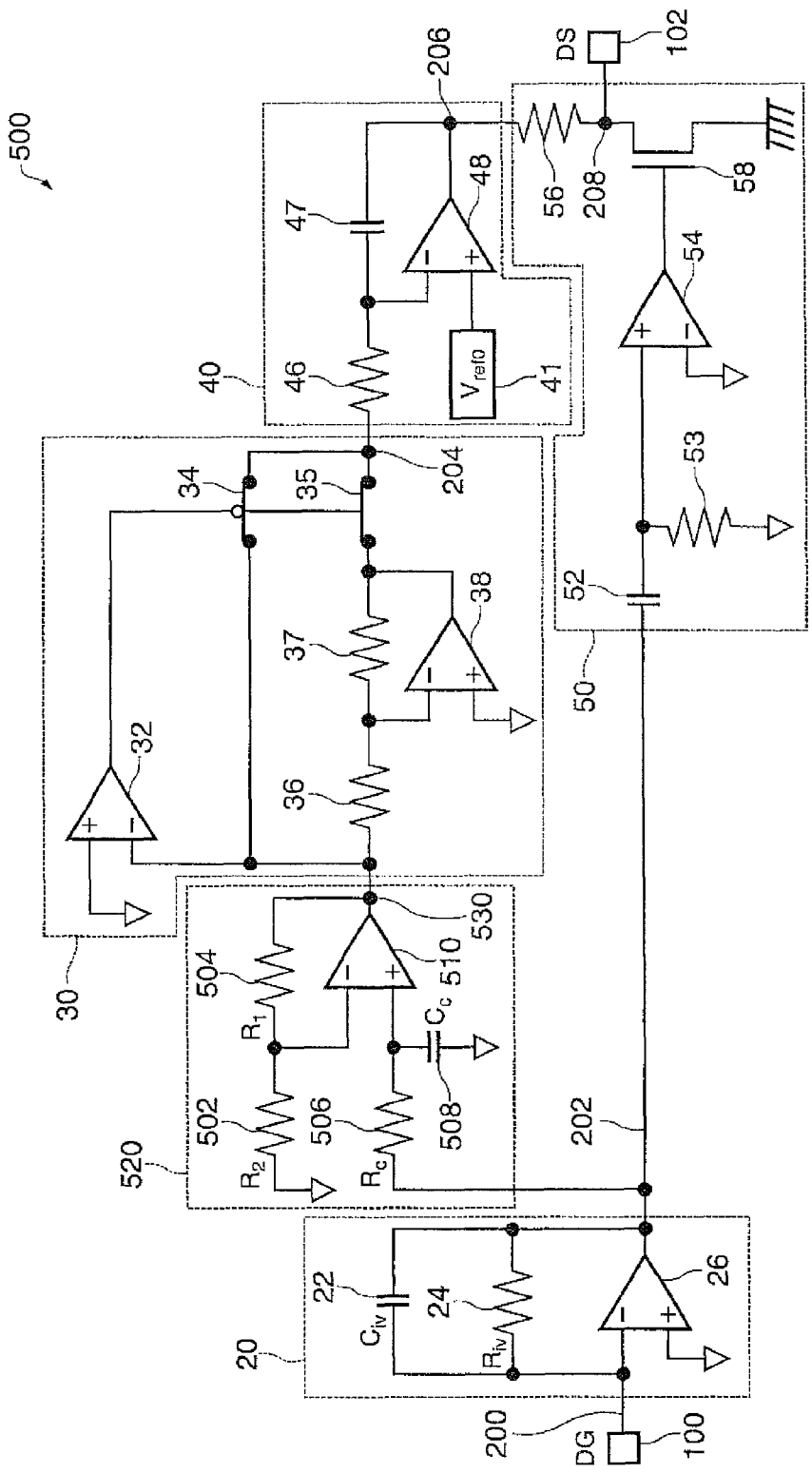
FIG. 7 is an example of a circuit diagram of the drive circuit of the comparative example.

A first embodiment of the invention will be explained with reference to FIGS. 1, 2, 3A through 3C, and 4A through 4C. Further, FIGS. 6 and 7 are also referred to in the explanation of a comparative example.

1.1. Configuration of Drive Circuit of Present Embodiment

Figure 1:
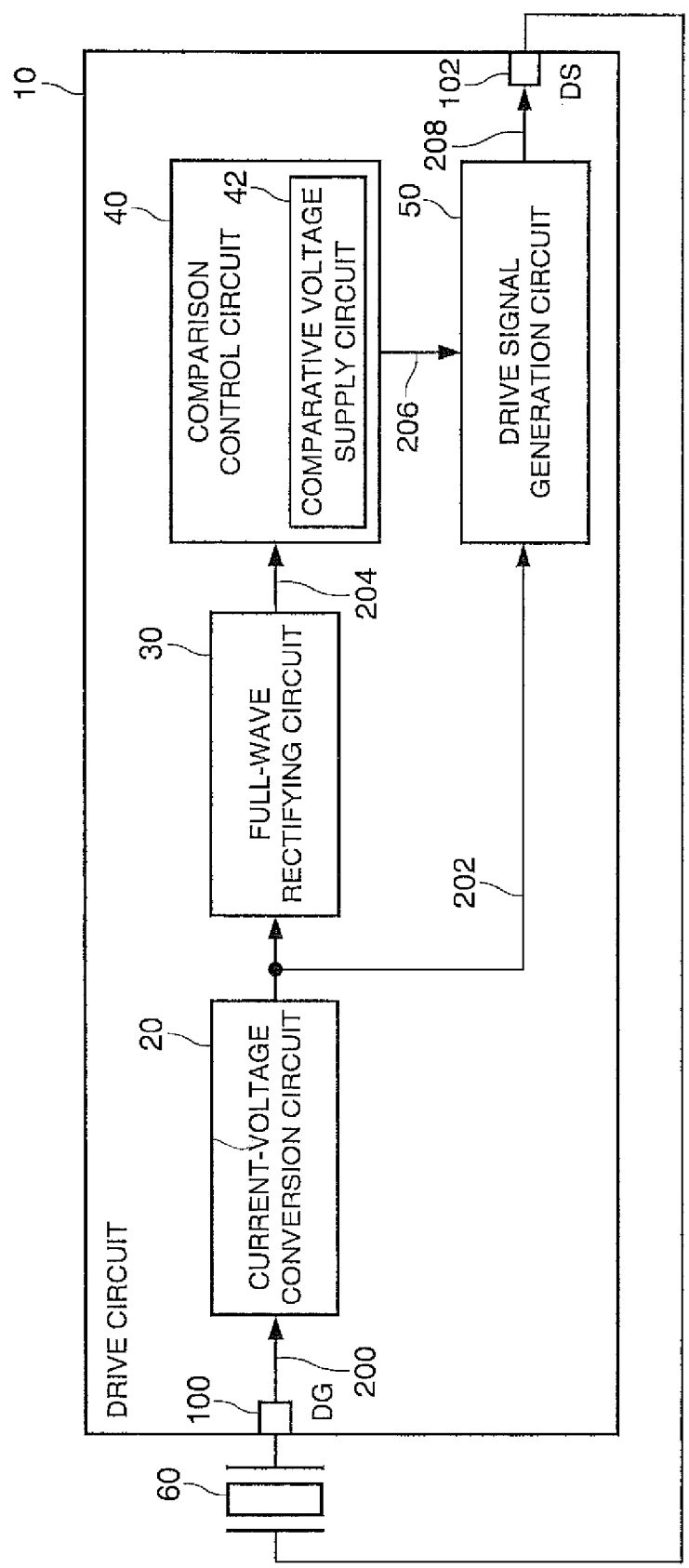
FIG. 1 is a block diagram of a drive circuit according to a first embodiment of the invention.

FIG. 1 is a block diagram of a drive circuit 10 according to the present embodiment. The drive circuit 10 includes a current-voltage conversion circuit 20, a full-wave rectifying circuit 30, a comparison control circuit 40, and a drive signal generation circuit 50.

The current-voltage conversion circuit 20 converts an excitation current 200 from a vibrator 60 into a voltage to thereby output an output voltage 202. The amplitude of the output voltage 202 is proportional to the amplitude of the excitation current 200.

The full-wave rectifying circuit 30 performs the full-wave rectification on the output voltage 202 from the current-voltage conversion circuit 20 to thereby obtain a roughly direct-current voltage, and thus outputs an output voltage 204.

The comparison control circuit 40 compares the output voltage 204 from the full-wave rectifying circuit 30 with a comparative voltage, and then outputs an output voltage 206 as a signal reflecting the comparison result to the drive signal generation circuit 50. Then, the drive signal generation circuit 50 controls the amplitude of a drive signal 208 based on the output voltage 206.

The comparison control circuit 40 includes a comparative voltage supply circuit 42 for supplying the comparative voltage. The comparative voltage supply circuit 42 has a resistor (a second resistor) made of a material identical to the material of a resistor (a first resistor) included in the current-voltage conversion circuit 20, and generates the comparative voltage with the second resistor. It is also possible to generate the comparative voltage by, for example, a constant current source and the second resistor as in the present embodiment. According to this configuration, it results that the same temperature characteristics as that of the first resistor are reflected in the comparative voltage. The drive signal generation circuit 50 generates the drive signal 208 based on the output voltage 202 from the current-voltage conversion circuit 20.

It should be noted that the drive circuit 10 of the present embodiment can include an input terminal (DG) 100 and an output terminal (DS) 102. On this occasion, the drive circuit 10 is used with the vibrator 60 connected to the input terminal 100 and the output terminal 102. The vibrator 60 can be, for example, a quartz crystal vibrator or a vibrator used for a physical quantity measuring device such as a gyro sensor.

1.2. Comparison with Drive Circuit of Comparative Example

Prior to showing an example of a circuit diagram of the drive circuit according to the present embodiment, a drive circuit of a comparative example will be explained with reference to FIGS. 6 and 7. After explaining the drive circuit of the comparative example, the example of the circuit diagram of the drive circuit according to the present embodiment is shown using FIG. 2, and is then compared.

1.2.1. Drive Circuit of Comparative Example

FIG. 6 is a block diagram of the drive circuit 500 of the comparative example. Differently from the drive circuit 10 (FIG. 1) of the present embodiment, a compensation circuit 520 for compensating the variation in resistance is included, and a comparative voltage supply circuit 41 as a constant voltage source having no association with the first resistor is used. It should be noted that the same constituents as those shown in FIG. 1 are provided with the same reference numerals, and the explanation therefor will be omitted.

The compensation circuit 520 has a resistor corresponding to the second resistor of the drive circuit 10 (FIG. 1) of the present embodiment. In other words, the compensation circuit 520 has a resistor, which has the same temperature characteristics as those of the first resistor included in the current-voltage conversion circuit 20, for canceling out the temperature variation of the first resistor.

The compensation circuit 520 receives the output voltage 202 from the current-voltage conversion circuit 20. Further, the full-wave rectifying circuit 30 receives the output voltage 530 from the compensation circuit 520 instead of the output voltage 202 from the current-voltage conversion circuit 20. FIG. 7 shows an example of a circuit diagram of the drive circuit 500 of the comparative example shown in FIG. 6. It should be noted that the same constituents as those shown in FIGS. 1 and 6 are provided with the same reference numerals, and the explanation therefor will be omitted.

The current-voltage conversion circuit 20 is composed of for example, a capacitor 22, a resistor 24, and an operational amplifier 26. The capacitance of the capacitor 22 is $C_{iv}$, and the resistance value of the resistor 24 is $R_{iv}$. The transfer function $H_{iv}$ of the current-voltage conversion circuit 20 is expressed by Formula (1). It should be noted that the resistor 24 corresponds to the first resistor.

$$H_{iv}(j\omega) = \frac{-R_{iv}}{1 + j\omega C_{iv} R_{iv}} \quad (1)$$

Then, the gain component (the conversion gain) $G_{iv}$ becomes approximately $R_{iv}$ if $R_{iv} \gg C_{iv}$ is fulfilled.

$$G_{iv} = R_{iv} \quad (2)$$

The compensation circuit 520 includes a low-pass filter composed of a resistor 506 and a capacitor 508, and a noninverting amplifier circuit composed of resistors 502, 504, and an operational amplifier 510. The resistance value of the resistor 506 is $R_c$, the capacitance of the capacitor 508 is $C_c$, and the resistance values of the resistors 502, 504 are $R_2$, $R_1$, respectively. The transfer function $H_{co}$ of the compensation circuit 520 is expressed by Formula (3).

$$H_{co}(j\omega) = \frac{1}{1 + j\omega C_c R_c} \times \frac{R_1 + R_2}{R_2} \quad (3)$$

Here, assuming the case in which the attenuation rate of the low-pass filter is 1/10, and the gain of the noninverting amplifier circuit is 10 times, Formula (3) is simplified. Formula (4) is obtained by replacing the gain in the noninverting amplifier circuit with a numerical value.

$$H_{co}(j\omega) = \frac{10}{1 + j\omega C_c R_c} \quad (4)$$

The gain component $G_{co}$ of the transfer function $H_{co}$ expressed by Formula (4) is expressed by Formula (5).

$$G_{co} = \frac{10}{\sqrt{1 + (\omega C_c R_c)^2}} \quad (5)$$

Following the assumption described above, if it is assumed that the gain component $G_{co}$ expressed by Formula (5) is 1, $(\omega C_c R_c)^2 = 99 \gg 1$ is obtained. Therefore, the gain component $G_{co}$ is obtained as Formula (6).

$$G_{co} = \frac{10}{\omega C_c R_c} \quad (6)$$

Here, advantages of the compensation circuit 520 will be explained. The gain component $G_{sub}$ with consideration for the current-voltage conversion circuit 20 and the compensation circuit 520 is obtained as Formula (7) from Formula (2) and Formula (6).

$$G_{sub} = R_{iv} \times \frac{10}{\omega C_c R_c} \quad (7)$$

In Formula (7), $R_{iv}$ and $R_c$ exist in the numerator and the denominator, respectively. Therefore, by using the material, which is the same as that used in the resistor 24 (the resistance value of $R_{iv}$) of the current-voltage conversion circuit 20, in the resistor 506 ($R_c$) of the low-pass filter of the compensation circuit 520, the influence of the manufacturing variation in the resistance value and the temperature variation is prevented. Therefore, the variation in the resistor 24 (the first resistor) can be absorbed by the compensation circuit 520.

The full-wave rectifying circuit 30 performs the full-wave rectification on the output voltage 530 from the compensation circuit 520 to thereby output the output voltage 204. Then, the output voltage 204 is smoothed by an integrator in the posterior stage, and therefore, a nearly direct-current voltage can be obtained. The full-wave rectifying circuit 30 inputs the output voltage 530 from the compensation circuit 520 into a comparator 32 to thereby compare it with an analog ground potential. Further, switches 34, 35 are exclusively set ON using the output of the comparator 32.

Here, the full-wave rectifying circuit 30 includes an inverting amplifier circuit composed of resistors 35, 37, and an operational amplifier 38. Here, it is possible to assume that the resistance values of the resistors 36, 37 are equal to each other, and the gain is 1. Since the phase varies 180° due to the inverting amplifier circuit, by combining it with the switches 34, 35, it results that only the positive part of the sine wave is output as the output voltage 204.

On this occasion, the gain component $G_{re}$ in the full-wave rectifying circuit 30 is expressed as Formula (8) from the average value of the sine wave.

$$G_{re} = \frac{2}{\pi} \quad (8)$$

The comparison control circuit 40 includes an integrator composed of a resistor 46, a capacitor 47, and an operational amplifier 48. The voltage thus made to be direct-current obtained by the full-wave rectifying circuit 30 is compared with the comparison voltage $V_{ref0}$ from the comparative voltage supply circuit 41 as the constant voltage source, and feedback is provided so that the voltage becomes equal to $V_{ref0}$. Subsequently, the output voltage 206 from the operational amplifier 48, which is the feedback signal, is input to the drive signal generation circuit 50. The output voltage 206 is used for controlling the amplitude of the drive signal 208. The drive signal generation circuit 50 includes a high-pass filter composed of a capacitor 52 and a resistor 53, a comparator 54, and an N-channel transistor 58 for outputting the drive signal 208. The high-pass filter for receiving the output voltage 202 from the current-voltage conversion circuit 20 adjusts the phase. The output of the high-pass filter is input to the comparator 54. Subsequently, the output is compared with the analog ground potential and is then output as a rectangular wave. When the N-channel transistor 58 is switched ON due to the rectangular wave, the drive signal 208 becomes in a low level. In contrast, if the N-channel transistor 58 is switched OFF, the drive signal 208 becomes in a high level. Here, since the high level of the drive signal 208 reflects the output voltage 206 of the comparison control circuit 40 connected to the drain of the N-channel transistor 58 via the resistor 56, the amplitude of the drive signal 208 is controlled.

1.2.2. Problems of Drive Circuit of Comparative Example

Denoting the amplitude of the excitation current 200 with $I_{dr}$, in the drive circuit 500 of the comparative example, there is a relationship of Formula (9) between the amplitude $I_{dr}$ and the comparative voltage $V_{ref0}$ according to Formula (7) and Formula (8).

$$V_{ref0} = I_{dr} \times R_{iv} \times \frac{10}{\omega C_c R_c} \times \frac{2}{\pi} \quad (9)$$

Formula (10) is obtained by transforming Formula (9) into an expression for the amplitude $I_{dr}$ of the excitation current 200.

$$I_{dr} = \left(\frac{\pi}{20} \times V_{ref0}\right) \times \omega C_c \times \frac{R_c}{R_{iv}} \quad (10)$$

As described above, the temperature variations and so on of the resistances $R_c$ and $R_{iv}$ cancel each other out. Further, the comparative voltage $V_{ref0}$ is a constant voltage, and the value in the bracket of the right-hand side of Formula (10) is a constant. Therefore, since the temperature variation of the capacitance $C_c$ is sufficiently small as long as it is used at the same frequency (ω) even if the temperature of the use environment of the drive circuit 500 of the comparative example varies, the amplitude $I_{dr}$ of the excitation current 200 is kept constant.

However, the capacitance $C_c$ also includes a variation due to the manufacturing variation. Further, it can usually occur that the circuit is used at a plurality of frequencies. Therefore, taking not only the temperature variation but also the manufacturing variation and the variation in frequency into consideration, it is difficult for the drive circuit 500 of the comparative example to obtain the constant excitation current 200.

1.2.3. Solution of Problems by Drive Circuit of Present Embodiment

Figure 2:
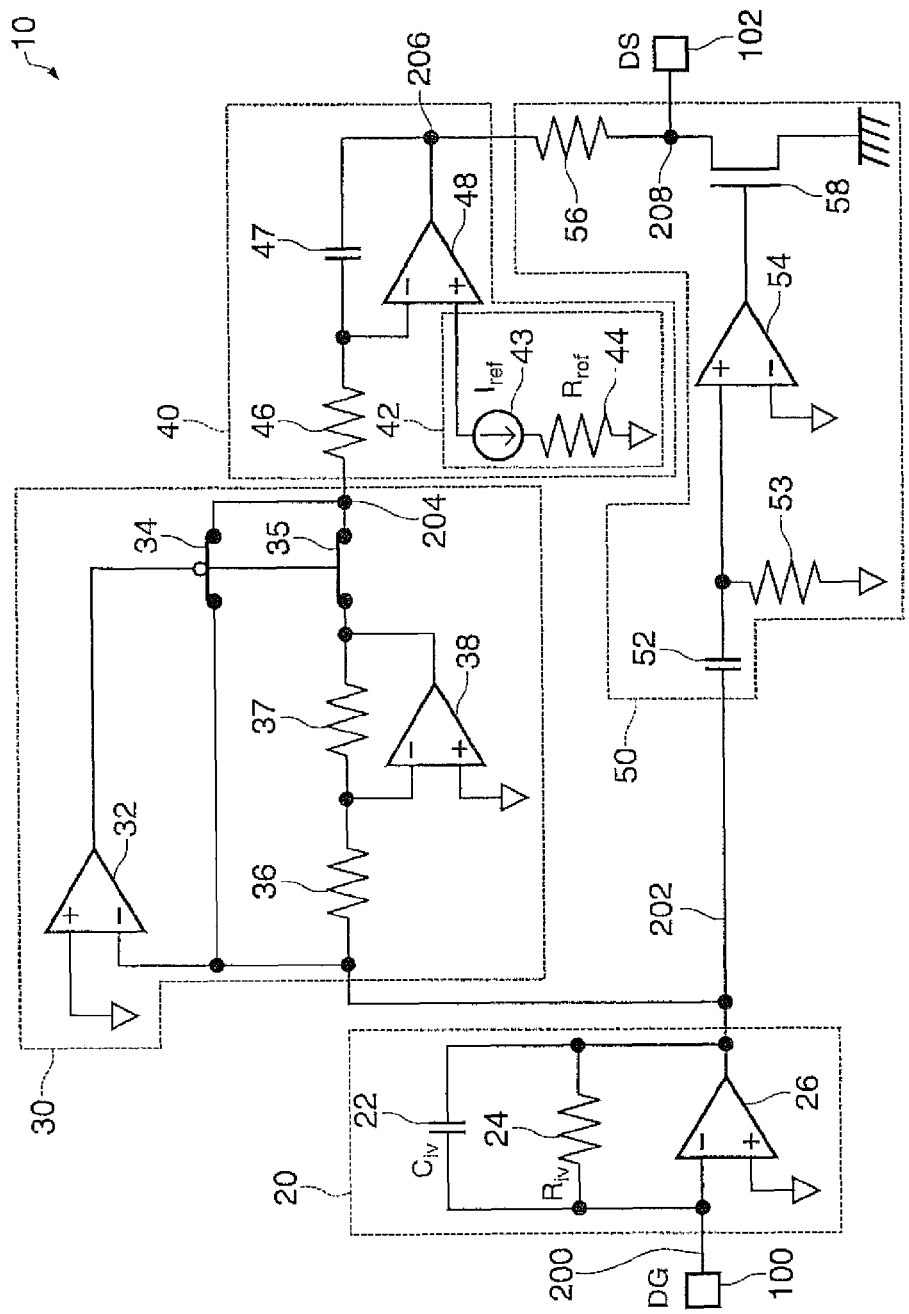
FIG. 2 is an example of a circuit diagram of the drive circuit according to the first embodiment.

FIG. 2 shows an example of a circuit diagram of the drive circuit 10 of the present embodiment. It should be noted that the same constituents as those shown in FIGS. 1, 6, and 7 are provided with the same reference numerals, and the explanation therefor will be omitted.

In the drive circuit 10 of the present embodiment, the compensation circuit 520 is eliminated from the drive circuit 500 (FIGS. 6 and 7) of the comparative example, and the comparative voltage supply circuit 42 is provided with a resistor 44 (the second resistor), which functions so as to absorb the variation in the resistor 24 (the first resistor). The comparative voltage supply circuit 42 supplies the comparative voltage generated by the constant current source 43 and the resistor 44. Denoting the current value of the constant current source with $I_{ref}$, and the resistance value of the resistor 44 with $R_{ref}$, the comparative voltage $V_{ref}$ is expressed as Formula (11).

$$V_{ref} = I_{ref} \times R_{ref} \quad (11)$$

The comparative voltage supply circuit 41 of the drive circuit 500 of the comparative example supplies the comparative voltage as a constant voltage. The comparative voltage supply circuit 42 of the drive circuit 10 of the present embodiment is different therefrom in the point that the comparative voltage also varies with, for example, the temperature variation of the resistance value $R_{ref}$ of the resistor 44. Here, when correcting Formula (9) and taking Formula (11) into consideration, there exists the relationship of Formula (12) between the amplitude $I_{dr}$ of the excitation current 200 and the comparative voltage $V_{ref}$ with respect to the drive circuit 10 according to the present embodiment.

$$I_{ref} \times R_{ref} = I_{dr} \times R_{iv} \times \frac{2}{\pi} \quad (12)$$

Formula (13) is obtained by transforming Formula (12) into an expression for the amplitude $I_{dr}$ of the excitation current 200.

$$I_{dr} = \left(\frac{\pi}{2} \times I_{ref}\right) \times \frac{R_{ref}}{R_{iv}} \quad (13)$$

As expressed in Formula (10), in the drive circuit 500 of the comparative example, the amplitude $I_{dr}$ is affected by the vibrational frequency (ω) and the capacitance $C_c$ of the low-pass filter. However, as expressed in Formula (13), the drive circuit 10 of the present embodiment does not include the vibrational frequency ω and the capacitance C. Therefore, the constant amplitude $I_{dr}$ can be obtained as long as the temperature variations and so on of the resistances $R_{ref}$ and $R_{iv}$ cancel each other out. It should be noted that it is preferable to connect the current-voltage conversion circuit 20 and the comparison control circuit 40 to a common ground potential in order for making the temperature characteristics of the resistances $R_{ref}$ and $R_{iv}$ identical to each other.

As described above, it is possible for the drive circuit 10 of the present embodiment to keep the amplitude of the excitation current of a vibrator constant irrespective not only of the temperature variation but also of the manufacturing variation and the variation in frequency.

1.2.4. Advantages of Drive Circuit of Present Embodiment

The advantages of the drive circuit according to the present embodiment will be explained with reference to FIGS. 3A through 3C. FIG. 3A is a table showing conditions of a simulation. FIGS. 3B and 3C are diagrams showing the variation in the excitation current in the drive circuit of the comparative example, and that in the drive circuit according to the first embodiment, respectively.

In the case, for example, in which the drive circuit shown in FIG. 2 or FIG. 7 is applied to a physical quantity measuring device, it is required to keep the amplitude of the excitation current constant in order for stably measuring the measurement signal proportional to the excitation current. Further, it is required to increase the amplitude of the excitation current to thereby improve the S/N ratio in order for measuring the measurement signal with accuracy. On the other hand, if the amplitude of the excitation current is made excessively large, it results that the vibrator is operated with excessive electrical power, which causes breakage such as a broken vibrator. Here, the current in the case of causing the breakage of the vibrator is defined as a breaking current, and the amplitude of the excitation current with which the breaking current is caused is defined as a limit value.

In such a case, it is required that the amplitude $I_{dr}$ of the excitation current is smaller than the limit value even when taking the temperature variation, the manufacturing variation, and the variation in frequency into consideration, and at the same time, is as large as possible in view of the improvement of the S/N ratio. In the design of the drive circuit, for example, the resistance values of the first resistor and the second resistor are tentatively determined in the TYP condition based on Formula (13) and past data, and then adjusted based on the estimation on how much margin exists to the limit value by the simulation. FIGS. 3B and 3A show an example of the result of the simulation on that occasion. Here, the TYP condition denotes a typical condition, and is a condition in which the temperature is ordinary temperature of, for example, 25° C., and a process parameter takes a standard value.

In this example, the simulation conditions 1 through 4 are determined as shown in FIG. 3A, and as the number of the condition increases, the number of objects to be considered increases, and therefore, the condition becomes severer. For example, in the condition 1, only the variation in the resistance value of each of the first resistor and the second resistor (the resistor included in the low-pass filter in the drive circuit of the comparative example) in accordance with the variation (e.g., −45° C. through 80° C.) of the use temperature is considered, and on and after the condition 2, the variation in the capacitance due to the manufacturing variation is further considered, and on and after the condition 3, the vibrational frequency is set higher. Here, "$f_0$" denotes the lowest frequency determined by the specification, and "$f_2$" denotes the highest frequency, for example. Further, it is assumed that "$f_1$" is a frequency intervening therebetween. FIG. 3B shows the simulation result in the case in which the resistances $R_c$ and $R_{iv}$ are determined so that the amplitude $I_{dr}$ of the excitation current becomes equal to a target value T in the TYP condition in the drive circuit 500 of the comparative example shown in FIG. 7. In the condition 1, the range of the variation in the amplitude $I_{dr}$ indicated by the arrow is small, and the maximum value thereof is also smaller than the limit value F. Since the temperature variations of the respective resistances $R_c$, $R_{iv}$ cancel each other out, the expected result can be obtained.

However, as expressed by Formula (10), the amplitude $I_{dr}$ in the drive circuit 500 of the comparative example is affected by the variation in the frequency (m) and the capacitance $C_c$. Therefore, in the condition 2, the range of the variation in the amplitude $I_{dr}$ is larger. Further, in the conditions 3 and 4, the level and the range of the variation in the amplitude $I_{dr}$ increase with the variation in the frequency, and in some cases, the amplitude $I_{dr}$ exceeds the limit value F. Therefore, judging from the simulation result, redesigning for setting the amplitude $I_{dr}$ lower than the target value T in the TYP condition becomes necessary. This means the fact that the S/N ratio is reduced and the accuracy of measurement can be degraded if the drive circuit 500 of the comparative example is applied to the physical quantity measuring device.

FIG. 3C shows the simulation result in the case in which the resistances $R_{ref}$ and $R_{iv}$ are determined so that the amplitude $I_{dr}$ of the excitation current becomes equal to a target value T in the TYP condition in the drive circuit 10 of the present embodiment shown in FIG. 2. Since the temperature variations of the respective resistances $R_{ref}$, $R_{iv}$ cancel each other out, and therefore, the amplitude is not affected by the variation in the frequency (ω) and the capacitance $C_c$ differently from the case of FIG. 3B, the expected result can be obtained in all of the conditions 1 through 4.

Moreover, there is sufficient margin between the maximum value of the variation and the limit value F, and there is a room for further increasing the amplitude $I_{dr}$. In other words, it is possible to shift the target value from "T" to a new target value $T_n$ (>T). On this occasion, the resistance values of the first and second resistors are newly determined by substituting $T_n$ into the left-hand side of Formula (13). This means the fact that the S/N ratio can be raised and the accuracy of measurement can be improved if the drive circuit 10 according to the present embodiment is applied to the physical quantity measuring device.

1.3. Homogenization of Material of Resistors

In the drive circuit according to the present embodiment, it is required for the first and second resistors to have the same temperature characteristics and to show the same manufacturing variation. Therefore, the layout process for homogenizing the material of the first and second resistors will be explained with reference to FIGS. 4A through 4C. It should be noted that in the present embodiment, the homogenization of the material means not only to uniform the type of the resistor but also to make the characteristics identical including the local variation (e.g., unevenness in the sheet resistance due to the variation in the amount of implantation of ion in the ion-implantation process) due to the difference in location in the layout.

Figure 4A:
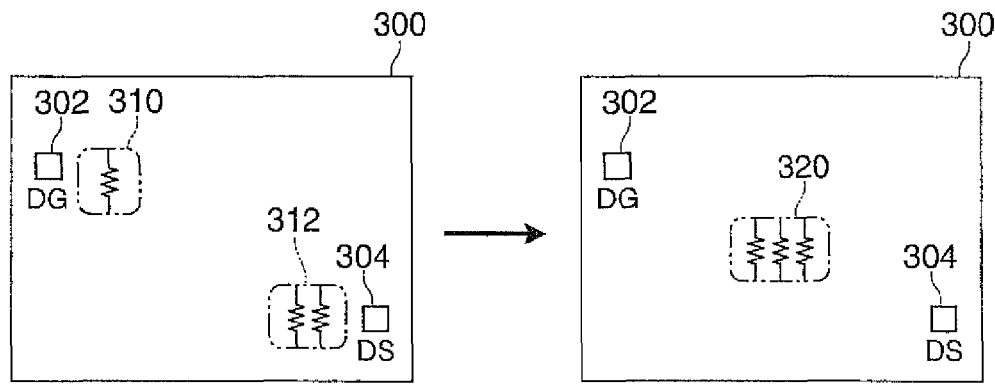
FIG. 4A is a schematic diagram of a layout.
Figure 4B:
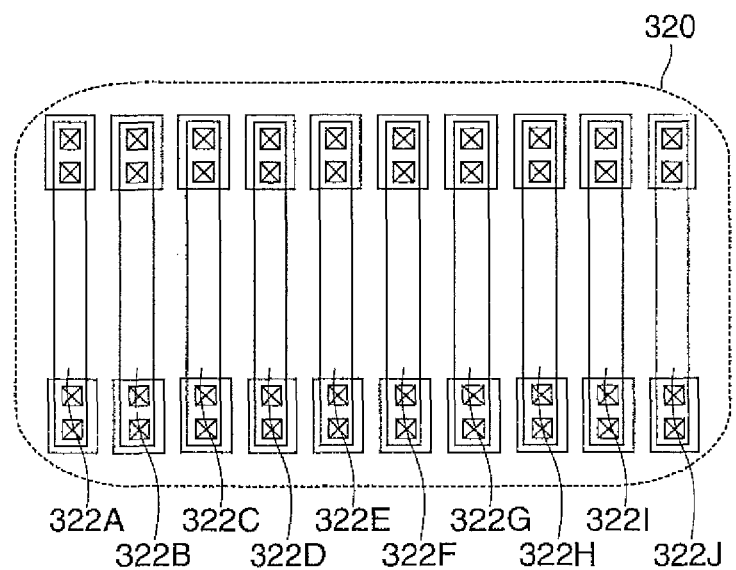
FIG. 4B is a diagram showing an arrangement example of resistor cells in a resistor area.

FIG. 4A is a schematic diagram of a layout 300 of the drive circuit 10 (see FIG. 2) according to the present embodiment. A cell 302 is a pad or a node of an input terminal DG, and a cell 304 is a pad or a node of an output terminal DS. Resistor areas 310, 312, and 320 are each an area where resistors are disposed, and resistor cells are mainly arranged in an array fashion in each of the resistor areas. Here, "in an array fashion" denotes that the same resistor cells are arranged at certain intervals as shown in FIG. 4B. It should be noted that dummy cells can be disposed therebetween, and it is not required that the distances between the adjacent resistor cells are the same.

As shown in the left part of FIG. 4A, the first resistor (the resistor 24 with the resistance value of $R_{iv}$ shown in FIG. 2) included in the current-voltage conversion circuit 20 for receiving the signal from the input terminal DG tends to be disposed in the resistor area 310 in the vicinity of the cell 302 of the input terminal DG. Further, the second resistor (the resistor 44 with the resistance value of $R_{ref}$ shown in FIG. 2) for generating the comparative voltage related to the drive signal output from the output terminal DS tends to be disposed in the resistor area 312 in the vicinity of the cell 304 of the output terminal DS. In this case, there is a possibility of causing the local variation in the first and second resistors, and in particular, the possibility rises as the area of the drive circuit increases. Therefore, the local variation is prevented from occurring by disposing the first and second resistors in the same resistor area such as the resistor area 320 as shown in the right part of FIG. 4A.

FIG. 4B is a diagram showing an arrangement example of resistor cells 322A through 322J in the resistor area 320. In this example, each of the resistor cells 322A through 322J is a resistor element of the same type having the same resistance value. It should be noted that FIG. 43 represents a top view in a certain layer, and shows only a part of the resistor cell. The resistor cells 322A through 322J are connected to metal or the like in another layer via through holes or the like, and realize various resistance values using series connection or parallel connection. If the resistance values $R_{iv}$ and $R_{ref}$ are formed using the combinations of the resistor cells 322A through 322J, there is only a little chance to cause the local variation since these resistor cells are disposed in the narrow area in the same fashion.

Figure 4C:
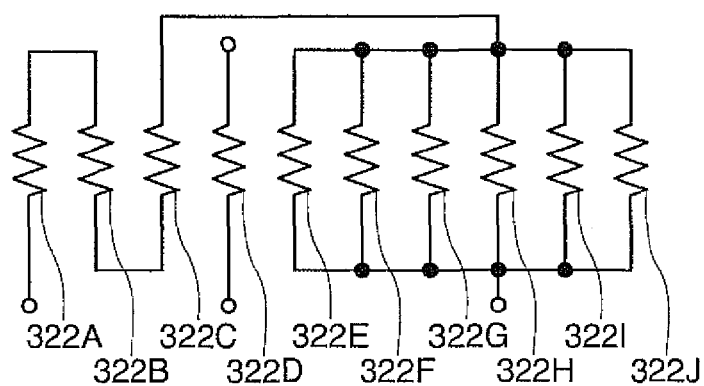
FIG. 4C is a diagram showing a connection example of the resistor cells shown in FIG. 4B.

FIG. 4C is a diagram showing a connection example of the resistor cells shown in FIG. 43. It is assumed, for example, that $R_{ref}$=47.5 kΩ and $R_{iv}$=15 kΩ are required from Formula (13) in the case in which each of the resistor cells has the resistance value of 15 kΩ. In this case, the resistance value $R_{ref}$ can be formed by connecting the resistor cells 322A through 322C in series to each other (45 kΩ), and then further connecting them to the resistor cells 322E through 322J (2.5 kΩ) connected in parallel to each other. Further, the resistor cell 322D intervening therebetween can be used as the resistance value $R_{iv}$. As described above, by forming both of the resistance values $R_{ref}$ and $R_{iv}$ with the combinations of the same resistor cells, the possibility of causing the variation in the characteristics can be reduced. Further, by disposing the resistor cells constituting the resistance value $R_{iv}$ and the resistor cells constituting the resistance value $R_{ref}$ in a dispersed manner, the possibility of causing the local variation can further be reduced. In particular, in the case in which the resistance value $R_{iv}$ is composed of a plurality of resistor cells, such resistor cells and the resistor cells constituting the resistance value $R_{ref}$ can be disposed alternately.

2. Application Example

An application example of the drive circuit according to the invention will be explained with reference to FIG. 5. The same constituents as those shown in FIGS. 1, 2, 3A through 3C, and 4A through 4C are provided with the same reference numerals, and the explanation therefor will be omitted.

2.1. Physical Quantity Measuring Device

Figure 5:
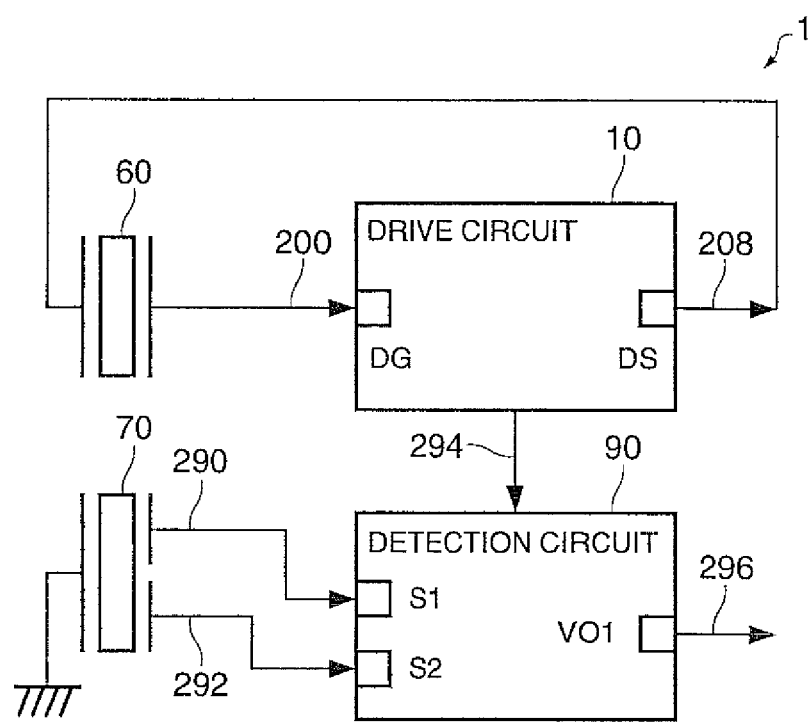
FIG. 5 is a diagram showing a physical quantity measuring device of an application example.

FIG. 5 is a diagram showing an example of the physical quantity measuring device 1. The physical quantity measuring device 1 includes the drive circuit 10, a detection circuit 90, the vibrator 60, and a vibrator 70. The detection circuit 90 receives measurement signals 290, 292 as, for example, differential signals from a detection section provided to the vibrator 70. The measurement signals are proportional to the excitation current of the vibrator 60. Then, the detection circuit 90 receives necessary information from the drive circuit 10 as an internal signal 294, then performs a predetermined calculation, and then outputs the detection signal 296 corresponding to the physical quantity to be measured.

The physical quantity measuring device 1 is, for example, a gyro sensor, and can output the angular velocity thus detected as the detection signal 296. Further, the physical quantity measuring device 1 is, for example, an acceleration sensor, and can output the acceleration thus detected as the detection signal 296. On this occasion, it is also possible that arithmetic processing is performed in the detection circuit 90, and the velocity information is output as the detection signal 296, or the distance information is output as the detection signal 296.

Due to the advantages of the drive circuit 10 according to the present embodiment described with reference to FIGS. 3A through 3C, the physical quantity measuring device 1 is capable of stably performing the measurement irrespective of the temperature variation, the manufacturing variation, and the variation in frequency, and thus performing the measurement with accuracy because of the high S/N ratio.

Besides these exemplifications, the invention includes configurations (e.g., configurations having the same function, the same way, and the same result, or configurations having the same object and the same advantages) substantially the same as any one of the configurations described in the embodiment section. Further, the invention includes configurations obtained by replacing a non-essential part of the configurations described in the embodiment section. Further, the invention includes configurations exerting the same advantages or configurations capable of achieving the same object as the configurations described in the embodiment section. Further, the invention includes configurations obtained by adding technologies known to the public to the configurations described in the embodiment section.

What is claimed is:

1. A drive circuit adapted to output a drive signal for exciting a vibrator, comprising:
    a current-voltage conversion circuit adapted to convert an excitation current input into a voltage;
    a rectifying circuit adapted to perform rectification on an output voltage from the current-voltage conversion circuit;
    a drive signal generation circuit adapted to generate the drive signal based on the output voltage from the current-voltage conversion circuit; and
    a comparison control circuit adapted to compare an output voltage from the rectifying circuit with a comparative voltage to thereby control an amplitude of the drive signal,
    wherein the comparison control circuit includes a comparative voltage supply circuit adapted to supply the comparative voltage, and
    the comparative voltage supply circuit generates the comparative voltage with a constant current source and a second resistor made of material having a temperature characteristic the same as a temperature characteristic of a first resistor included in the current-voltage conversion circuit.

2. The drive circuit according to claim 1, wherein
The first resistor and the second resistor are disposed in the same resistor area in an array fashion.

3. The drive circuit according to claim 1, wherein
The first resistor and the second resistor are each composed of one of a resistor cell and a combination of plurality or resistor cells, the resistor cells each having the same resistance value.

4. The drive circuit according to claim 1, wherein
The resistance value of the first resistor and the resistance value of the second resistor are determined based on a result of calculation of comparing an amplitude of the excitation current and a limit value with which a breakage current causing breakage of the vibrator flows.

5. The drive circuit according to claim 1, wherein
The current-voltage conversion circuit and the comparison control circuit are connected to a common ground potential.

6. A physical quantity measuring device comprising the drive circuit according to claim 1.

7. A physical quantity measuring device comprising the drive circuit according to claim 2.

8. A physical quantity measuring device comprising the drive circuit according to claim 3.

9. A physical quantity measuring device comprising the drive circuit according to claim 4.

10. A physical quantity measuring device comprising the drive circuit according to claim 5.

* * * * *